United States Patent [19]

Wheatley, Jr. et al.

[11] 3,921,090

[45] Nov. 18, 1975

[54] OPERATIONAL TRANSCONDUCTANCE AMPLIFIER

[75] Inventors: Carl Franklin Wheatley, Jr., Somerset; Harold Allen Wittlinger, Pennington, both of N.J.

[73] Assignee: RCA Corporation, New York, N.Y.

[22] Filed: Nov. 14, 1974

[21] Appl. No.: 523,759

[52] U.S. Cl. .................... 330/30 D; 330/19; 330/22

[51] Int. Cl.² .......................................... H03F 3/45

[58] Field of Search ....................... 330/19, 22, 30 D

[56] References Cited

UNITED STATES PATENTS 3,876,955 4/1975 Ahmed ............................ 330/22 X

OTHER PUBLICATIONS

Hellwarth, G. A.,–"Electrical Amplifier with Input–Bias Network", IBM Technical Disclosure Bulletin, Vol. 14, No. 3, pp. 966–967, Aug. 1971.

*Primary Examiner*—R. V. Rolinec
*Assistant Examiner*—Lawrence J. Dahl
*Attorney, Agent, or Firm*—H. Christoffersen; S. Cohen; A. L. Limberg

[57] ABSTRACT

An operational transconductance amplifier comprises first and second transistors connected in a gain-controlled emitter-coupled differential amplifier configuration and provided active collector loads by the input ports of a first and a second current mirror amplifiers, respectively. The balanced signals appearing at the output ports of the first and the second current mirror amplifiers in response to the balanced signal variations in the collector currents of the first and second transistors are converted to single-ended form by a third current mirror amplifier having its input and output ports connected to the output ports of the first and second current mirror amplifiers, respectively. Improved high-frequency operation of the gain controllable operational transconductance amplifier as an analog multiplier is obtained by applying common mode currents to the input ports of the first and second current mirror amplifiers. The responses to these common mode currents counteract and cancel each other in the output signal from the operation transconductance amplifier.

8 Claims, 3 Drawing Figures

OPERATIONAL TRANSCONDUCTANCE AMPLIFIER

Figure 1:
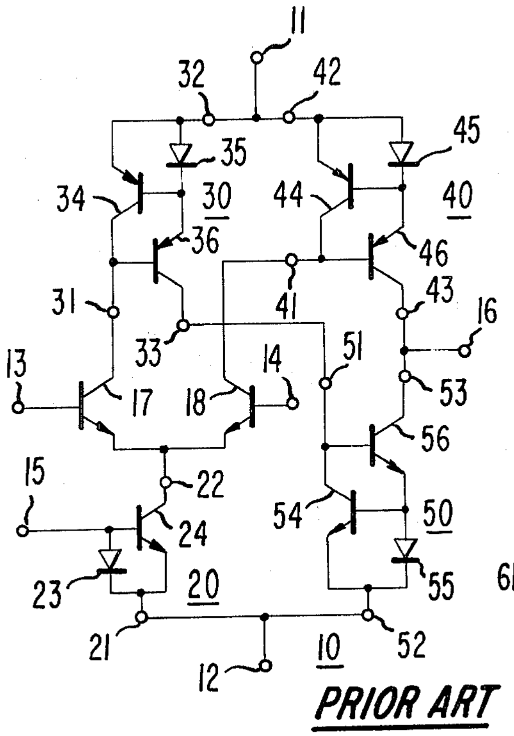
PRIOR ART FIG. 1

The present invention relates to an improvement in controlled-gain operational transconductance amplifier design.

Controlled-gain operational transconductance amplifiers are widely used as analog multipliers. A first (or X) signal potential is applied between the base electrodes of a pair of transistors connected in an emitter-coupled differential amplifier configuration and is multiplied by a second (or Y) signal current applied to their joined emitter electrodes, thereby to provide push-pull collector currents proportional to the product of the first and second input signals. These push-pull collector currents are respectively applied to the input port of a first current mirror amplifier and to the input port of a second current mirror amplifier. The output port of the first current mirror amplifier is connected to the input port of a third current mirror amplifier. The third current mirror amplifier provides an output signal current at its output port, which is proportional to the signal current supplied to its input port by the first current mirror amplifier but which has been inverted and is therefore suitable for constructive additive combination with the output signal current of the second current mirror amplifier. This constructive combination of signals provides a final output signal proportional to the product of the first and second (X and Y) input signals.

The foregoing type of operational transconductance amplifier provides an analog multiplier which is useful as a modulator for developing double-sideband amplitude-modulation signals. As is known, a pair of these analog multipliers can be connected in a bridge configuration to suppress the carrier in the double-sideband amplitude modulation signal if desired.

It is sought to use the analog multiplier as a modulator for modulating video signals on carrier signals in the 10 to 50 MHz frequency range, for example. However, these modulators singly or in combination exhibit poor linearity during troughs of modulation particularly when the carrier signal frequency exceeds 1 MHz or so.

We have discovered that the poor linearity, in large part, is due to an undesirable time delay in the recovery of the circuit from over-modulation. We have also discovered the reason for this delay to be due to discharge of stray capacitances in the operational transconductance amplifier occurring when the collector currents of the transistors in the emitter-coupled transistor amplifier are reduced to zero value during troughs of modulation. The base-emitter junctions of the transistors in the current mirror amplifiers are no longer maintained in sustained forward conduction during troughs. During a sustained deprivation of current, the potentials across these base-emitter junctions do not just decay to the threshold potentials associated with the onset of conduction. Rather, the stray capacitances in the circuit continue to leak charge causing the base-emitter potentials of the transistors to dacay to levels well-below the threshold of conduction. When current is re-applied to the input ports of the current mirrors, a short time is required to recharge the stray capacitances associated with the base-emitter junctions of the current mirror amplifiers before the junctions can be drawn back into conduction.

The solution of the present application to the problem discussed above is to supply auxiliary bias currents to the input ports of the first and second current mirror amplifiers which accept the respective push-pull collector currents of the emitter-coupled differential amplifier transistors. These auxiliary bias currents continuously cause additional forward current in the transistors in the current mirror amplifiers and maintain a substantial current through their base-emitter junctions even during troughs of modulation. At the same time, because of the inherent common-mode rejection of the interconnection of the first, second and third current mirror amplifiers, these auxiliary bias currents, which are common-mode in nature, are not responded to in the operational transconductance output circuit.

Although these auxiliary bias currents need not be particularly small with respect to the quiescent collector currents of the emitter-coupled differential amplifier transistors, the common mode offset potential error at the output of the analog multiplier is proportional to the value of these auxiliary currents, and it is usually desirable to maintain this error as small as possible. The auxiliary bias currents therefore are preferably trickle currents which are about one percent or less of the quiescent collector currents of the emitter-coupled differential amplifier transistors. These relatively low level trickle currents suffice to prevent the undesired discharge of stray capacitances in the first and second current mirror amplifiers, to which they are applied. Furthermore, the current provided at the output port of the first current mirror amplifier, in response to the auxiliary current applied to its input port, suffices to prevent the undesired discharge of stray capacitance in the third current mirror amplifier.

Figure 2:
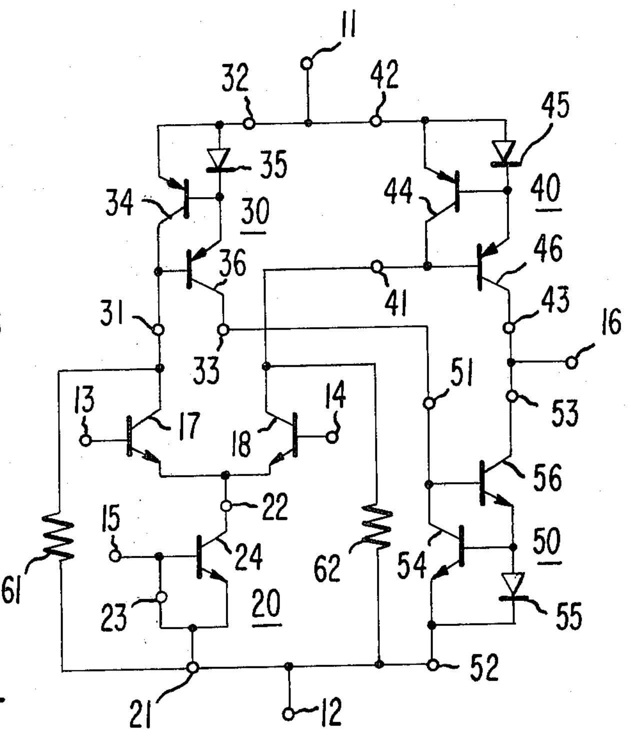
Figure 3:
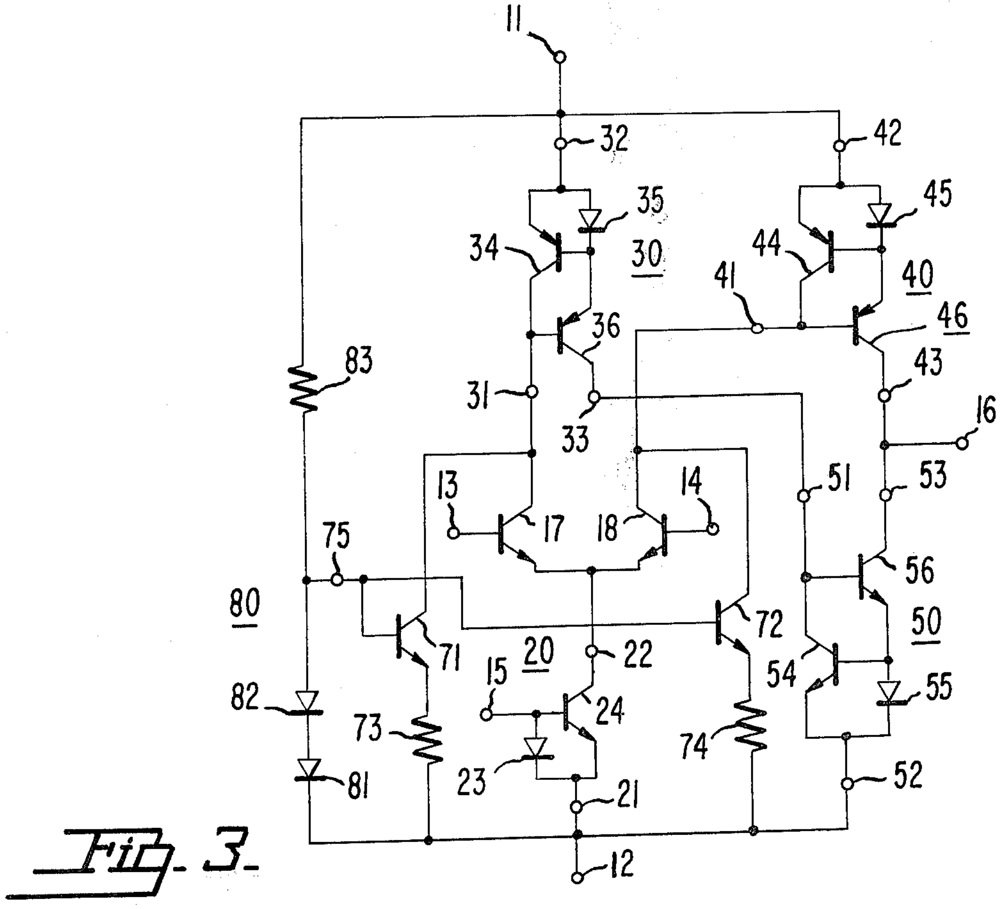

In the drawing:

FIG. 1 is a schematic diagram of a typical operational transconductance amplifier as known in the prior art; and FIGS. 2 and 3 are schematic diagrams of operational transconductance amplifiers which embody the present invention.

The operational transconductance amplifier 10 of FIG. 1 is typical of the prior art. Terminals 11 and 12 are for application of positive and negative operating potentials, respectively. A first (or X) input signal potential applied differentially between terminals 13 and 14 will be multiplied by a second (or Y) input signal current applied to terminal 15, with an output signal current proportional to the product XY of the input signals being available from output terminal 16.

Terminal 15 to which the second input signal current is applied is the input terminal of a current mirror amplifier 20. Current mirror amplifier 20 also has a common terminal 21 connected to terminal 12 and has an output terminal 22 connected to the joined emitter electrodes of differential amplifier transistors 17 and 18. A second input signal current applied to terminal 15 flows primarily through diode 23 to develop a potential thereacross which when applied to the base-emitter junction of transistor 24 causes it to demand a collector current proportional to the second input signal current. This collector current for transistor 24 must be supplied by the combined emitter currents of differential amplifier transistors 17 and 18.

The relative conduction of the base-emitter junctions of transistors 17 and 18 is determined by the difference in the potentials at their base electrodes. The base electrodes of transistors 13 and 14 conventionally are each referred to the same quiescent potential, which is intermediate between the positive and negative operating potentials respectively applied to terminals 11 and 12, with the first input signal being used to vary the potentials at terminals 13 and 14 a few millivolts with respect to each other. A bipolar transistor tends in its operation to follow the following equation:

$$V_{BE} = \frac{kT}{q} \ ln \ \frac{I_E}{I_S} \quad (1)$$

where $V_{BE}$ is its base-emitter potential,
k is Boltzmann's constant,
T is absolute temperature,
q is the charge on an electron,
$I_E$ is its emitter current, and
$I_S$ is its saturation emitter current.

Numerical subscripts used in connection with these quantities identify them as related to the transistor so numbered. Assume a potential $\Delta V_{BE}$ to be applied between terminals 13 and 14

$$\Delta V_{BE} = V_{BE14} - V_{BE13} = \frac{kT}{q} ln \ \frac{I_{E14}}{I_{S14}} - \frac{kT}{q} ln \ \frac{I_{E13}}{I_{S13}} \quad (2)$$

If transistors 13 and 14 are alike and at the same temperature, $$I_{S13} = I_{S14} \quad (3)$$

which can be used to simplify equation 2 to the following form.

$$\Delta V_{BE} = \frac{kT}{q} \ ln \ \frac{I_{E14}}{I_{E13}} \quad (4)$$

which describes the relative conduction of the base-emitter junctions of transistors 13 and 14 as a function of the potential between their base electrodes.

However, the amount of the combined emitter currents withdrawn from transistors 17 and 18 is determined by the collector current demand of transistor 24. The collector currents of transistors 17 and 18 equal their respective emitter currents, as is true of any transistor with substantial common-emitter forward current gain. Therefore, the amount of the collector current demanded by transistor 24 in response to current applied to terminal 15 affects in a linear manner the gain of the emitter-coupled differential amplifier formed by transistors 17 and 18. This linear gain-control phenomenon is at the heart of the analog multiplier operation.

The collector current of transistor 17 is withdrawn from the input port of current mirror amplifier 30 (between its input terminal 31 and its common terminal 32 connected to positive energizing potential terminal 11.) Similarly, the collector current of transistor 18 is withdrawn from the input port of current mirror amplifier 40 (between its input terminal 41 and its common terminal 42, also connected to positive energizing potential terminal 11). Each of the current mirror amplifiers 30 and 40 are signal-inverting amplifiers, with their output currents proportional in magnitude to their input currents. So, variations of their output currents are inversely related to each other. Another current mirror amplifier 50 has its input port (between its input terminal 51 and its common terminal 52) connected to negative energizing terminal 12 connected to the output port of current mirror amplifier 30 (between its common terminal 32 and its output terminal 33). Current mirror amplifier 50 is also a signal-inverting amplifier and the push-pull connection of its output port (between its common terminal 52 and its output terminal 53) with the output port of current mirror amplifier (between its common terminal 42 and its output terminal 43) provides for constructive combination of their output signal current variations and for destructive combination of the quiescent components of their output signal currents, insofar as connection to terminal 16 is concerned.

By making the product of the current gains of current mirror amplifiers 30 and 50 equal to the current gains of current mirror amplifier 40, the quiescent current flow supplied from the output terminal 43 of current mirror amplifier 40 just equals that demanded by current mirror amplifier 50 at its output terminal 53, presuming differential amplifier transistors 17 and 18 to be biased for equal collector currents. This is desirable, since there will be no quiescent current to a load connected to terminal 16. Standard practice is to make the current gains of current mirror amplifiers 30 and 40 equal and the magnitude of the current gain of current mirror amplifier 50 unity. The quiescent potential at terminal 16 is established by the load connection and can range between the positive and negative energizing potentials applied to terminals 11 and 12, respectively, to within one volt of either.

In some operational transconductance amplifiers, the current mirror amplifiers 30, 40 and 50 may take one of the other known forms. In general, a current mirror amplifier such as 30, for example, includes a grounded-emitter amplifier transistor arranged to accept an applied input current at its collector current by reason of a collector-to-base feedback connection. The base-to-emitter potential established for this transistor is applied to another semiconductor junction 35 to establish the output current of the current mirror amplifier.

As mentioned in the introductory portion of the applications, the present inventors have found that when either of the differential amplifier transistors 17 and 18 is removed from conduction, distortion occurs. The forward bias currents which are normally applied to certain of the semiconductor junctions in the ensuing mirror amplifiers 30 and 40 or the ensuing amplifier 50 are removed. If this removal of forward bias current persists, the charge stored in the stray capacitance of these junctions leaks away, reducing the potential across them still further. When "forward bias" currents are re-applied to these junctions, it takes a period of time to re-charge the stray capacitances associated with the junctions to a potential permitting the junctions to be forward biased beyond their respective conduction threshold potentials. During this period of time, each of the affected current mirror amplifiers will fail to respond at its output port to the signal applied to its input port. It is this lack of response which introduces the undesired non-linearities into the analog multiplier transfer characteristics.

According to the present invention, this delay, during which current mirror amplifier response is interrupted, can be avoided by preventing the cutting off of the supply of input currents to the current mirror amplifiers 30, 40 and 50. Then, the stray capacitances of the normally-forward-biased junctions in these current mirror amplifiers will not be discharged because of either or both of transistors 17 and 18 being removed from conduction.

FIG. 2 illustrates one solution of the present invention to the problem above. A pair of resistive elements 61 and 62 are connected from a point of fixed potential to the input terminals 31 and 41, respectively, of current mirror amplifiers 30 and 40. Current mirror amplifiers of the types described in the foregoing paragraphs tend to have well-defined potentials at their input terminals over a wide range of input currents, coming about because of the regulating action of the transistors (34, 44, 54) which are conditioned either to accept applied input currents or alternatively to supply withdrawn input currents. In the particular type of current mirror amplifier represented by 30 and 40, their input ports are regulated to twice the offset potential of a forward-biased semiconductor junction. The particular potential to which the interconnected ends of resistive elements 61 and 62 are connected is not of importance so long as it is sufficiently negative to forward bias the base-emitter junctions of transistors 36 and 34 in current mirror amplifier 30 and of transistors 46 and 44 in current mirror amplifier 40.

The current flow in resistive element 61 will be determined by the operating potential applied between terminals 11 and 12 less the offset potential at the input port between terminals 31 and 32 of current mirror amplifier 30, all divided by the resistance of resistive element 61, in accordance with Ohm's Law. The current flow through resistive element 62 is similarly determined by the potential thereacross being divided by its resistance.

The auxiliary bias currents flowing through resistive elements 61 and 62, respectively, to the input ports of current mirror amplifiers 30 and 40, respectively, are arranged to be in fixed proportion to each other. This proportion is such that the auxiliary bias current through resistive element 61 is substantially equal to the auxiliary bias current flowing through resistive element 62 multiplied by the current gain of the current mirror amplifier 40 and divided by the current gain of the current mirror amplifier 30 and further divided by the current gain of the current mirror amplifier 50. This proportioning of the auxiliary bias currents flowing in resistive elements 61 and 62, respectively, will result in the responses to them at the output terminal 16 counteracting each other. That is, the quiescent bias currents flowing through these two transistors cause no quiescent current flow into or out of the terminal 16.

To obtain this fixed proportion between the respective auxiliary bias current flows in resistors 61 and 62 in view of the potentials thereacross being equal, the relative conductances of resistors 61 and 62 are similarly proportioned. That is, the ratio of the resistance of resistive element 61 to that of resistive element 62 is the inverse of the fixed proportion of the auxiliary bias currents which it is desired to cause to flow through them.

Certain other advantages are obtained when the auxiliary bias currents are applied to the input ports of current mirror amplifiers 30 and 40. The inverting gain characteristic that exists between terminals 13 and 16 disappears as transistors 17 and current mirror amplifiers 30 and 50 are removed from conduction in the FIG. 1 prior art circuit. In certain instances, the feedthrough path between terminals 13 and 16—arising from stray capacitances and coupling through the integrated circuit substrate, for instance—will then exhibit a non-inverting characteristic that can introduce oscillatory tendencies in a feedback loop when the multiplier is included in such a loop. The auxiliary bias applied to the input ports of current mirror amplifiers 30 and 40 tends to keep the impedance levels at the input ports of the current mirror amplifiers 30, 40, 50 lower during conditions where one or the other transistors 17 and 18 is non-conductive. This reduces the chances for stray coupling effects of the sort just described.

Another desirable effect is that troughs of modulation occur at slightly higher quiescent current levels for current mirror amplifiers 30, 40 and 50 than is otherwise the case. This slight absolute increase in current level is a substantial percentage increase during troughs of modulation, however, and proportionally increases the transconductance of the transistors in the current mirror amplifiers 30, 40, 50. This increase in transconductance reduces the impedances in the current mirror amplifiers and increases their $f_T$'s—that is, the frequency range over which their current gain exceeds unity. In practical terms, this means an effective increase in the bandwidth of the current mirror amplifiers for a given value.

FIG. 3 illustrates how the auxiliary bias currents applied to the input terminals 31 and 41 of current mirror amplifier 30 and 40, respectively, can be supplied from the collector electrodes of transistors 71 and 72, respectively. The potential applied between terminals 12 and 75 by the internal bias supply 80 is used to bias the transistors 71 and 72 into conduction. This potential is applied to the parallel combination of (a) the serially-connected base-emitter junction of transistor 71 and its emitter degeneration resistor 73 and (b) the serially-connected base-emitter junction of transistor 72 and its emitter degeneration resistor 74. The resistances of their emitter degeneration resistors are in inverse ratio to the collector current flows desired in transistors 71 and 72, respectively. Preferably, (and necessarily in alternative configurations where degeneration resistors 73 and 74 are each replaced by direct connections) the transconductances of transistors 71 and 72, respectively, are in the same ratio as the desired auxiliary bias currents to be provided from the respective collector electrodes. Transistors 71 and 72 are generally embodied in the same monolithic semiconductor body and are provided with similar diffusion profiles, so the proportioning of their transconductances will be the same as the proportioning of the areas of their relative base-emitter junctions.

The internal bias supply 80 shown in FIG. 3 is one of the many types that can be used to apply a potential between terminals 12 and 75. Supply 80 comprises the serial connection of diodes 81 and 82 and a bleeder resistor 83 used to provide them forward bias current. The offset potential developed across the diodes 81 and 82 are substantially constant over a wide range of forward bias current, which forward bias current is determined in accordance with Ohm's Law by the potential between terminals 12 and 11 minus the (usually relative small) offset potentials across diodes 81 and 82, all divided by the resistance of resistor 83. Allowing for the offset potentials across the base-emitter junctions of transistors 71 and 72, the potentials across resistors 73 and 74 will each be substantially equal to the offset potential across diode 81 (between 550 and 700 millivolts for silicon semiconductor devices). The current flows through resistors 73 and 74 are each determined in accordance with Ohm's Law by this offset potential divided by the resistance of the respective resistor. The collector currents of transistors 71 and 72 are substantially equal to their respective emitter currents.

While transistors 71 and 72 are bipolar types as shown, field effect transistors may be used in their stead.

The present invention has been described in connection with emitter-coupled differential amplifier transistors 17, 18 having each of their collector electrodes connected by a single current mirror amplifier (30, 40) to, respectively, the input and the output ports of a current mirror amplifier (50) used for a final, balanced to single-end signal converter. However, the present invention is also utilized when those connections are made, not each with a single current mirror amplifier, but rather each with a cascade connection of an odd number of current mirror amplifiers. The current mirror amplifiers in each cascade connection would alternate in conductivity type—that is, the first current mirror amplifier in each cascade connection employing mirror transistors of a conductivity type complementary to the emitter-coupled transistors 17 and 18, the second current mirror amplifier in each cascade connection employing current mirroring transistors of the same conductivity type as the emitter-coupled transistors 17 and 18, and so on.

The present invention is also utilized in a transconductance multiplier wherein the final balanced to single-ended signal converter is a current mirror amplifier employing current mirroring transistors of a conductivity type complementary to that of emitter-coupled transistors 17 and 18 and wherein the collector electrodes of transistors 17 and 18 are respectively coupled to the input and output circuits either directly or by a cascade connection of an even number of current mirror amplifiers of alternating conductivity type.

Other examples of the use of the present invention will occur to one skilled in the art of electronic circuit design. Also, while the present invention has been described in connection with bipolar transistors it is useful in circuits wherein field-effect transistors are employed. The terms "base", "emitter" and "collector" in the claims include within their scope the terms "gate", "source" and "drain", respectively, with respect to the use of field-effect transistors in the construction of circuits embodying the present invention.

What is claimed is:

1. In combination:

a supply of first and second operating potentials;

an input amplifier having an input circuit for application of input signal and having a balanced output circuit for supplying first and second currents which vary in push-pull relationship to each other responsive to said input signal;

first and second transistors having emitter electrodes connected to said first operating potential, having their respective base electrodes connected to the balanced output circuit of said input amplifier to conduct respectively said first current and said second current, and having collector electrodes;

a current mirror amplifier having an input terminal to which said first transistor collector electrode is direct current conductively coupled, having a common terminal connected to said second operating potential, and having an output terminal to which said second transistor collector electrode is direct current conductively coupled; and first and second conductive means, said first conductive means connecting said first transistor base electrode to said second operating potential, said second conductive means connecting said second transistor base electrode to said second operating potential, for applying a sustained forward bias to the base electrodes of the first and second transistors whenever one or both of said first and said second currents is zero-valued or nearly so.

2. The combination set forth in claim 1 wherein said input amplifier comprises a pair of emitter-coupled further transistors.

3. The combination set forth in claim 1 having therein means connected to the emitter-electrodes of said further transistor for modulating their combined emitter currents.

4. In an operational transconductance amplifier comprising first and second transistors connected in emitter-coupled differential amplifier configuration to accept a first input signal between their respective base electrodes, means for applying a common-mode current varied in proportion with a second input signal to the joined emitter electrodes of said first and said second transistors, a first and a second current mirror amplifiers having their respective input ports connected to provide active collector loads respectively to said first transistor and to said second transistor and a third current mirror amplifier having its input port connected to the output port of said first current mirror amplifier and having its output port connected to the output port of said second current mirror amplifier at a point from which an output signal proportional to the product of said first signal and said common mode current is provided, the improvement comprising:

a source of first and second auxiliary bias currents in fixed proportion to each other applied respectively to the input port of said first current mirror amplifier and to the input port of said second current mirror amplifier, said fixed proportion such that said first auxiliary bias current is substantially equal to said second auxiliary bias current multiplied by the current gain of said second current mirror amplifier divided by the current gain of said first current mirror amplifier and further divided by the current gain of said third current mirror amplifier.

5. The improvement as set forth in claim 4 wherein said source comprises means for supplying bias currents at a level which is a small fraction of the quiescent input currents normally present at the input ports of said first and second current mirror amplifiers.

6. The improvement set forth in claim 4 wherein said source of auxiliary first and second bias currents in fixed proportion to each other comprises:

a source of bias potential and first and second resistive elements respectively connecting the input port of said first current mirror amplifier and the input port of said second current mirror amplifier each to said source of bias potential, the ratio of the resistance of said first resistive element to the resistance of said second resistive element being in a ratio substantially the inverse of said fixed proportion of said first auxiliary bias current to said second auxiliary bias current.

7. The improvement set forth in claim 6 wherein:

third and fourth transistors have respective principal conduction paths comprising said first resistive element and said second resistive element, respectively, and have control electrodes together with:

means for applying a potential to the joined control electrodes of said third and said fourth transistors to cause their principal conduction paths to supply said first and said second auxiliary bias currents in said fixed proportion.

8. A method for reducing the distortion introduced when overdriving a differential amplifier having a pair of transistors each with a current mirror amplifier input circuit connected as its collector load, which distortion appears in the output circuit of the current mirror amplifiers, comprising the steps of:

simultaneously supplying quiescent forward currents to the input terminals of both current mirrors at levels to maintain them both biased above their threshold for conduction despite the non-conduction of one of the transistors of said differential amplifier, and at relatively low levels compared to the collector current supplied by the more conductive of the transistors.

* * * * *